US011557680B2

(12) United States Patent
Jang et al.

(10) Patent No.: US 11,557,680 B2
(45) Date of Patent: Jan. 17, 2023

(54) THIN FILM TRANSISTOR, METHOD FOR MANUFACTURING THE SAME AND DISPLAY APPARATUS COMPRISING THE SAME

(71) Applicant: LG Display Co., Ltd., Seoul (KR)

(72) Inventors: Jaeman Jang, Paju-si (KR); JungSeok Seo, Paju-si (KR); PilSang Yun, Paju-si (KR); InTak Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 17/123,011

(22) Filed: Dec. 15, 2020

(65) Prior Publication Data

US 2021/0202760 A1 Jul. 1, 2021

(30) Foreign Application Priority Data

Dec. 27, 2019 (KR) .................. 10-2019-0176126

(51) Int. Cl.
*H01L 27/12* (2006.01)
*H01L 29/66* (2006.01)
*H01L 29/786* (2006.01)
*H01L 29/423* (2006.01)

(52) U.S. Cl.
CPC ...... *H01L 29/78696* (2013.01); *H01L 27/124* (2013.01); *H01L 29/42364* (2013.01); *H01L 29/66969* (2013.01); *H01L 29/7869* (2013.01)

(58) Field of Classification Search
CPC ............... H01L 27/124; H01L 27/3276; H01L 27/3258; H01L 29/66969; H01L 29/7869; H01L 29/78696; H01L 29/42364; H01L 29/78618
See application file for complete search history.

(56) References Cited

U.S. PATENT DOCUMENTS

| | | | | |
|---|---|---|---|---|
| 9,829,533 B2* | 11/2017 | Tsubuku | ........... | H01L 21/02554 |
| 11,296,215 B2* | 4/2022 | Tomida | .................. | H01L 29/78 |
| 11,329,166 B2* | 5/2022 | Hosaka | ............... | H01L 29/4908 |
| 2014/0252345 A1* | 9/2014 | Tsubuku | ........... | H01L 21/02554 |
| | | | | 257/43 |
| 2018/0350994 A1* | 12/2018 | Hosaka | ................. | H01L 29/423 |
| 2020/0243676 A1* | 7/2020 | Tomida | .................. | H01L 29/78 |
| 2021/0224520 A1* | 7/2021 | Huang | ................. | G09G 3/3607 |

FOREIGN PATENT DOCUMENTS

KR    10-2015-0050058 A    5/2015

* cited by examiner

*Primary Examiner* — Nikolay K Yushin
(74) *Attorney, Agent, or Firm* — Fenwick & West LLP

(57) ABSTRACT

A thin film transistor, a method for manufacturing the same and a display apparatus comprising the same are disclosed, in which the thin film transistor comprises a semiconductor formed on a substrate, a gate insulating film formed on the semiconductor, a gate electrode formed on the gate insulating film, a first insulating film formed on the substrate, a first conductor portion formed on the first insulating film and formed at one side of the semiconductor, and a second conductor portion formed on the first insulating film and formed at another side of the semiconductor, wherein a first portion of the first insulating film may be formed between the semiconductor and the first conductor portion, and a second portion of the first insulating film may be formed between the semiconductor and the second conductor portion.

24 Claims, 11 Drawing Sheets

THIN FILM TRANSISTOR, METHOD FOR MANUFACTURING THE SAME AND DISPLAY APPARATUS COMPRISING THE SAME

CROSS-REFERENCE TO RELATED APPLICATIONS

This application claims the benefit of Korean Patent Application No. 10-2019-0176126 filed on Dec. 27, 2019, which is hereby incorporated by reference as if fully set forth herein.

BACKGROUND

Technical Field

The present disclosure relates to a thin film transistor, a method for manufacturing the same and a display apparatus comprising the same.

Discussion of the Related Art

A transistor is widely used as a switching element or a driving element in the field of electronic apparatuses. Particularly, since a thin film transistor (TFT) may be manufactured on a glass substrate or plastic substrate, the TFT is widely used as a switching element of a display apparatus such as a liquid crystal display device or an organic light emitting device.

The thin film transistor may be formed in various structures depending on types of a material constituting an active layer, arrangement structures of electrodes (gate electrode, source electrode, and drain electrode), a method for forming a channel, etc.

Recently, an oxide semiconductor TFT (hereinafter, referred to as an oxide TFT) which has mobility higher than that of an amorphous silicon TFT and is easier for application of a large-sized area than a poly-silicon TFT is widely used.

A main example of an oxide TFT structure is a coplanar structure in which a gate insulating layer and a gate electrode, which are patterned on an active layer, are deposited, and a source electrode and a drain electrode, which are arranged on an inter-layer dielectric layer covering the deposited structure, are respectively connected with a source area and a drain area of the active layer through a contact hole that passes through the inter-layer dielectric layer.

In the oxide TFT of the coplanar structure, a middle area of the active layer is used as a channel area, and both side areas of the channel area are conductorized and used as a source area and a drain area. Since the carrier concentration of the conductorized source and drain areas is higher than that of the channel area, hydrogen diffusion from the source and drain areas to the channel area is generated.

A diffusion area (area having a characteristic changed by hydrogen diffusion) is formed between the source area and the channel area and between the drain area and the channel area by such hydrogen diffusion. The diffusion area may cause degradation, and it is difficult to adjust a width of the diffusion area in view of a manufacturing process of a TFT. For this reason, reliability of the TFT may be deteriorated.

Also, if the channel area is short, switching performance of the TFT may be improved. The diffusion area intensifies degradation and thus acts as a limitation to making a short channel area.

The disclosure of the above-described background art is owned by the inventor of the present disclosure to devise this specification or is technical information acquired by a process of devising this specification, but cannot be regarded as known art disclosed to the general public before this specification is filed.

BRIEF SUMMARY

The present disclosure has been made in view of the above problems, and it is an object of the present disclosure to provide a thin film transistor, a method for manufacturing the same and a display apparatus comprising the same, in which the thin film transistor is embodied to prevent hydrogen diffusion from occurring between a semiconductor used as a channel and first and second conductor portions used as source and drain areas.

It is another object of the present disclosure to provide a thin film transistor, a method for manufacturing the same and a display apparatus comprising the same, in which the thin film transistor is capable of embodying a short channel by preventing a diffusion area from occurring between a semiconductor and a first conductor portion and between the semiconductor and a second conductor portion.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising a semiconductor formed on a substrate, a gate insulating film formed on the semiconductor, a gate electrode formed on the gate insulating film, a first insulating film formed on the substrate, a first conductor portion formed on the first insulating film and formed at one side of the semiconductor, and a second conductor portion formed on the first insulating film and formed at another side of the semiconductor, wherein a first portion of the first insulating film may be formed between the semiconductor and the first conductor portion, and a second portion of the first insulating film may be formed between the semiconductor and the second conductor portion.

In accordance with another aspect of the present disclosure, the above and other objects can be accomplished by the provision of a method for manufacturing a thin film transistor comprising the steps of forming a semiconductor, a gate insulating film and a gate electrode, which are sequentially deposited on a substrate, forming a first insulating film on the substrate to cover at least a side of the semiconductor, and forming first and second conductor portions on the first insulating film to face each other at both sides of the semiconductor, wherein the step of forming the first and second conductor portions includes forming the first conductor portion at one side of the semiconductor by using the first insulating film formed at the one side of the semiconductor as a boundary and forming the second conductor portion at another side of the semiconductor by using the first insulating film formed at the another side of the semiconductor as a boundary.

In accordance with other aspect of the present disclosure, the above and other objects can be accomplished by the provision of a display apparatus comprising a display panel including at least one thin film transistor for driving each of a plurality of pixels connected to gate and data lines, wherein the at least one thin film transistor may include a thin film transistor according to the embodiment of the present disclosure.

Details according to various embodiments of the present disclosure in addition to the solutions of the above problems are included in the following description and drawings.

Since the thin film transistor according to the present disclosure includes an insulating film formed between a semiconductor used as a channel and first and second conductor portions used as source and drain areas to serve as a hydrogen diffusion prevention film, hydrogen diffusion from the first and second conductor portions to the semiconductor may be avoided.

Therefore, since a diffusion area is not formed between the semiconductor and the first conductor portion and between the semiconductor and the second conductor portion, degradation caused by the diffusion area may be prevented from occurring, whereby a short channel may be embodied and reliability of the thin film transistor may be improved.

Also, since the first and second conductor portions are formed of a material having resistance relatively lower than that of the semiconductor, conductorized resistance may be reduced, whereby a short channel may be embodied more easily.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Hereinafter, a thin film transistor, a method for manufacturing the same and a display apparatus comprising the same according to the embodiment of the present disclosure will be described with reference to the accompanying drawings and embodiments.

Figure 1:
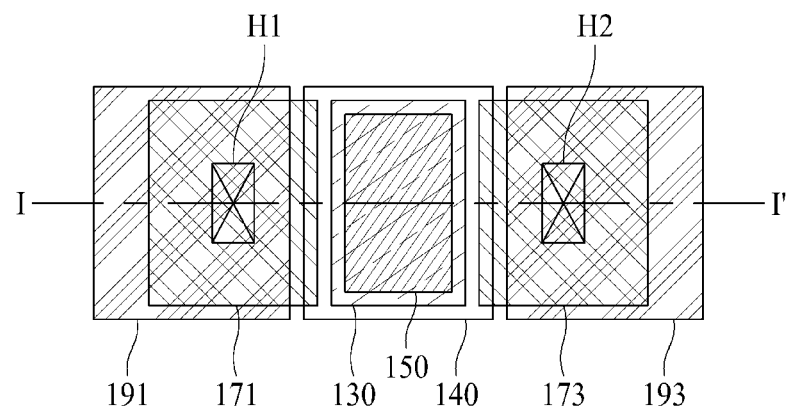
FIG. 1 is a plan view illustrating a thin film transistor according to one embodiment of the present disclosure.
Figure 2:
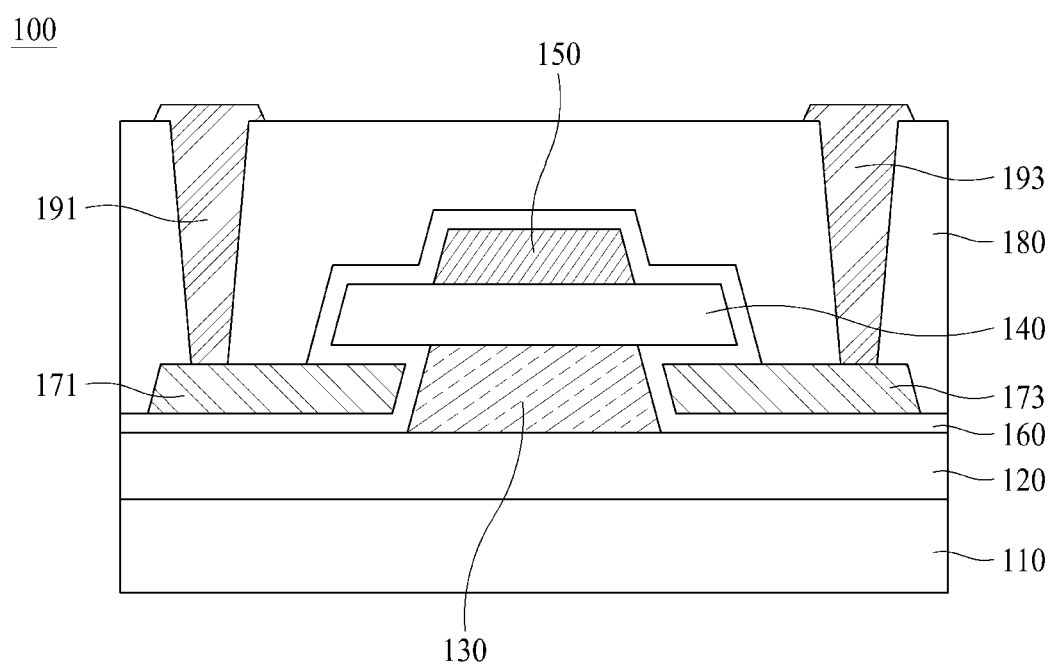
FIG. 2 is a cross-sectional view illustrating a thin film transistor taken along line I-I' of FIG. 1.
Figure 3:
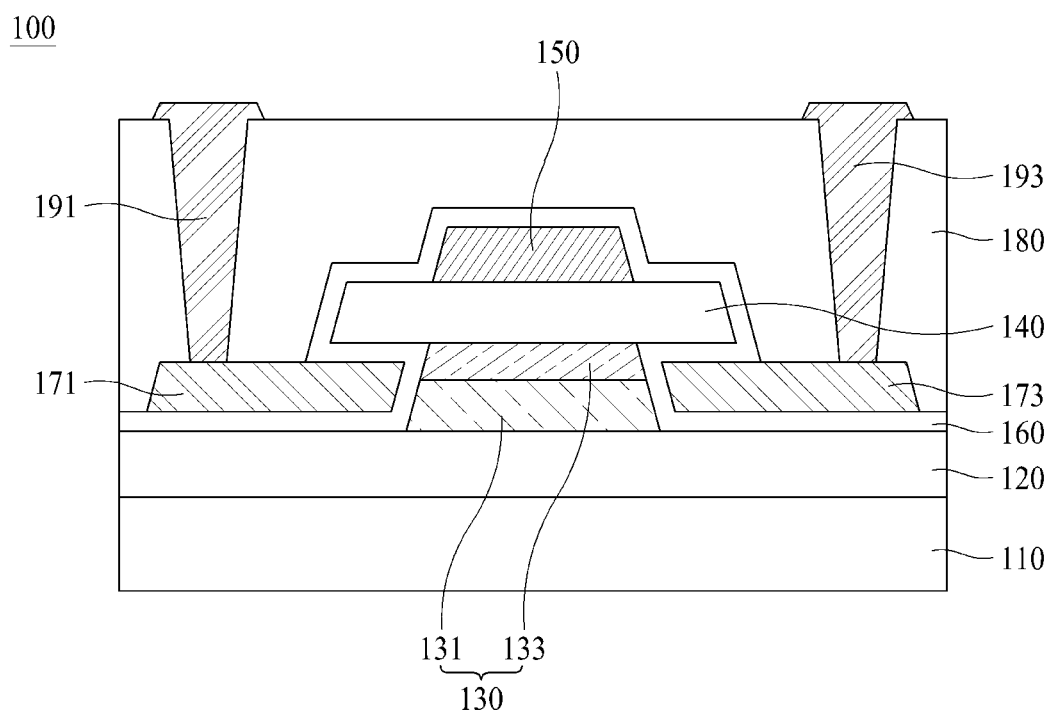
FIG. 3 is a cross-sectional views illustrating a thin film transistor according to another embodiment of the present disclosure.
Figure 4:
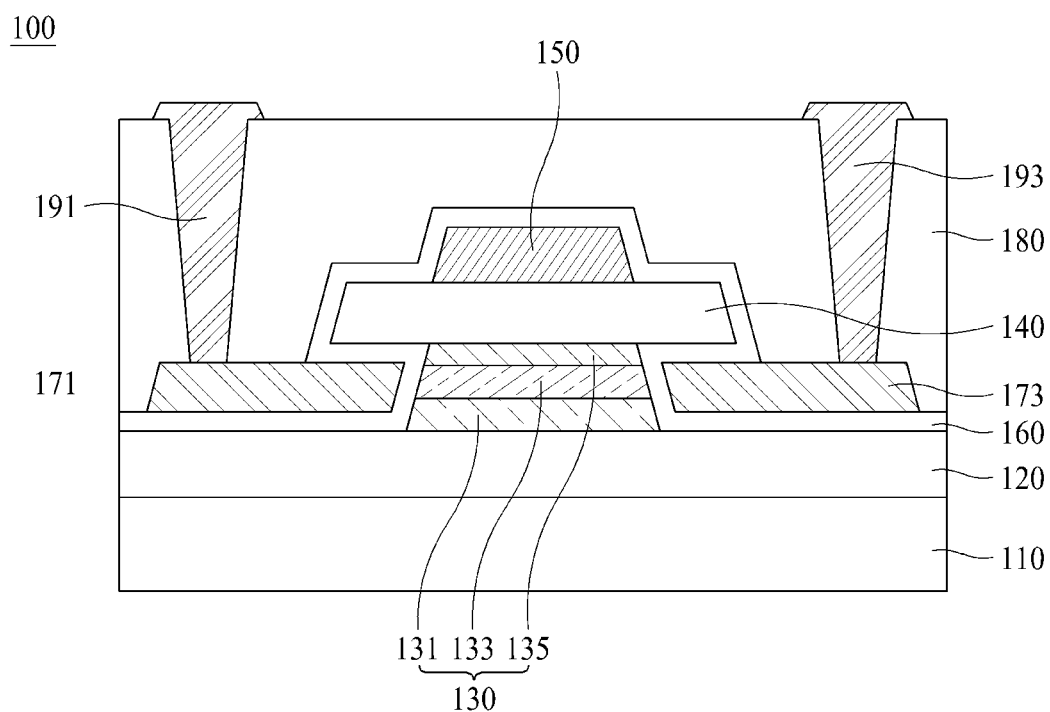
FIG. 4 is a cross-sectional views illustrating a thin film transistor according to other embodiments of the present disclosure.

FIG. 1 is a plan view illustrating a thin film transistor according to one embodiment of the present disclosure, FIG. 2 is a cross-sectional view illustrating a thin film transistor taken along line I-I' of FIG. 1, FIG. 3 is a cross-sectional views illustrating a thin film transistor according to another embodiments of the present disclosure, and FIG. 4 is a cross-sectional view illustrating a thin film transistor according to other embodiments of the present disclosure.

As shown in FIGS. 1 and 2, the thin film transistor 100 according to one embodiment of the present disclosure may include a substrate 110, a buffer layer 120 formed on the substrate 110, a semiconductor 130 formed on the buffer layer 120, a gate insulating film 140 formed on the semiconductor 130, and a gate electrode 150 formed on the gate insulating film 140.

The buffer layer 120 may be omitted in accordance with the embodiment, but a structure of the thin film transistor 100 comprising the buffer layer 120 will be described hereinafter.

Also, the thin film transistor 100 may include a first insulating film 160 formed to surround the semiconductor 130, the gate insulating film 140 and the gate electrode 150, a first conductor portion 171 formed at one side of the semiconductor 130 using the first insulating film 160 as a boundary, and a second conductor portion 173 formed at the other side of the semiconductor 130 using the first insulating film 160 as a boundary.

At this time, the first insulating film 160 is arranged between one side of the semiconductor 130 and the first conductor portion 171 and between the other side of the semiconductor 130 and the second conductor portion 173, and in order to form a MIS (Metal-Insulator-Semiconductor) contact structure, the first insulating film 160 is directly in contact with one side of the semiconductor 130 and the first conductor portion 171, and is directly in contact with the other side of the semiconductor 130 and the second conductor portion 173.

In detail, a first portion of the first insulating film 160 is directly in contact with one side of the semiconductor 130 and one side of the first conductor portion 171, and a second portion of the first insulating film 160 is directly in contact with the other side of the semiconductor 130 and one side of the second conductor portion 173.

The thin film transistor 100 may include a second insulating film 180 fully formed on the buffer layer 120, a first electrode 191 provided on the second insulating film 180 and connected with the first conductor portion 171 through a first contact hole H1 formed in the second insulating film 180, and a second electrode 193 provided on the second insulating film 180 and connected with the second conductor portion 173 through a second contact hole H2 formed in the second insulating film 180.

A glass substrate or a plastic substrate having flexible characteristic may be used as the substrate 110. If the plastic substrate is used as the substrate 110, the substrate 110 may be formed of polyimide, etc.

The buffer layer 120 may be formed of an inorganic material or an organic material. For example, the buffer layer 120 may include an insulating oxide such as $SiO_x$, $Al_2O_3$, $HfO_3$, and $Y_2O_3$.

The buffer layer 120 may be formed of a single layer or multiple layers to block particles such as water and oxygen permeated from the substrate 110, and may be omitted in accordance with the embodiment.

The semiconductor 130 is used as a channel, and may be formed of, but not limited to, IGZO (InGaZnO) made of In, Ga, Zn and O. The semiconductor 130 may include other oxide semiconductor materials, for example, at least one of IZO (InZnO)-, IGO(InGaO)-, ITO (InSnO)-, IGZO(In-GaZnO)-, IGZTO (InGaZnSnO), ITZO (InSnZnO)-IGTO (InGaSnO)-, IGTO(InGaSnO)-, GO(GaO)-, GZTO (GaZnSnO)-, ZTO(ZnSnO)-, and GZO (GaZnO)-based oxide semiconductor materials.

In FIG. 2, the semiconductor 130 is formed of a single layer, but may be formed of a multi-layered structure.

The semiconductor 130 may be formed of a two-layered structure as shown in FIG. 3 or a three-layered structure as shown in FIG. 4, or may be formed of a multi-layered structure of four or more layers.

As shown in FIG. 3, if the semiconductor 130 is formed of a two-layered structure, the semiconductor 130 may be comprised of a first semiconductor layer 131 and a second semiconductor layer 133 formed on the first semiconductor layer 131. At this time, one side of the first and second semiconductor layers 131 and 133 faces the first conductor portion 171 by interposing the first insulating film 160, and the other side of the first and second semiconductor layers 131 and 133 faces the second conductor portion 173 by interposing the first insulating film 160. In order to form the MIS contact structure, the first insulating film 160 is directly in contact with one side of each of the first and second semiconductor layers 131 and 133 and one side of the first conductor portion 171, and is directly in contact with the other side of each of the first and second semiconductor layers 131 and 133 and one side of the second conductor portion 173.

The first semiconductor layer 131 serves to protect the second semiconductor layer 133, and the second semiconductor layer 133 serves as a main channel layer.

Preferably, the first semiconductor layer 131 is formed of a material having a carrier concentration lower than that of the second semiconductor layer 133 at a thickness thicker than that of the second semiconductor layer 133.

The first semiconductor layer 131 may be formed of a material having a low carrier concentration but having low mobility to improve process margin. The first semiconductor layer 131 prevents electric characteristic of the second semiconductor layer 133 from being deteriorated by preventing hydrogen from being permeated from the outside of the semiconductor 130 to the second semiconductor layer 133 or preventing electrons of the second semiconductor layer 133 from being trapped in an insulating layer or insulating film outside the semiconductor 130.

The first semiconductor layer 131 has excellent film stability and excellent mechanical stability, and to this end, the first semiconductor layer 131 includes Ga. Ga forms stable coupling with oxygen, and a film that includes Ga oxide has excellent film stability.

According to one embodiment of the present disclosure, the first semiconductor layer 131 may include at least one of IGZO (InGaZnO)-, IGO(InGaO)-, IGTO (InGaSnO)-, IGZTO(InGaZnSnO)-, GZTO (GaZnSnO)-, GZTO (GaZnSnO)-, GZO (GaZnO)-, and GO(GaO)-based oxide semiconductor materials.

In order to have excellent film stability, the first semiconductor layer 131 may include Ga of 40 atomic % (at %) or more based on the number of atoms in comparison with all metal atoms of the first semiconductor layer 131. If a content of Ga of all metal atoms in the first semiconductor layer 131 is 40 at % or more, the first semiconductor layer 131 may have excellent film stability.

According to one embodiment of the present disclosure, all metal atoms of the first semiconductor layer 131 may be Ga. In this case, the first semiconductor layer 131 may be made of a GO(GaO) based oxide semiconductor material, and a content of Ga of all metal atoms in the first semiconductor layer 131 may be 100 at %.

The first semiconductor layer 131 having excellent film stability and mechanical stability has a resistance rate greater than that of the second semiconductor layer 133. The first semiconductor layer 131 also serves as a channel layer and thus should have a relatively good electric characteristic.

Considering the electric characteristic of the first semiconductor layer 131, the first semiconductor layer 131 may include Ga of 90 at % or less in comparison with all metal atoms, and may further include another metal atom that may improve mobility or a carrier concentration.

The first semiconductor layer 131 may be formed to be thicker (e.g., 15 nm or more) than the second semiconductor layer 133, and if the first semiconductor layer 131 has a high carrier concentration, the first semiconductor layer 131 may be mixed with the second semiconductor layer 133 and then conductorized, whereby it is required to properly control the carrier concentration.

The second semiconductor layer 133 may be formed of a material having a high mobility characteristic with a high carrier concentration to improve current characteristic, and may be formed of at least one of oxide semiconductors containing In/Sn. The second semiconductor layer 133 has hall mobility greater than that of the first semiconductor layer 131. Therefore, a main channel for a current flow may be formed in the second semiconductor layer 133.

According to one embodiment of the present disclosure, the second semiconductor layer 133 includes Indium (In). Indium (In) improves mobility of the semiconductor layer and increases charge density. The second semiconductor layer 133 including In may have excellent hall mobility. According to one embodiment of the present disclosure, the second semiconductor layer 133 may have an In concentration greater than that of the first semiconductor layer 131.

According to one embodiment of the present disclosure, the second semiconductor layer 133, for example, may be made of an oxide semiconductor material such as IZO (InZnO)-, IGO(InGaO)-, ITO (InSnO)-, IGZO(InGaZnO)-, IGZTO (InGaZnSnO)-, and ITZO (InSnZnO)-based oxide semiconductor materials. However, one embodiment of the present disclosure is not limited to the above materials, and the second semiconductor layer 133 may be made of other oxide semiconductor materials known in the art. For example, the second semiconductor layer 133 may be made of GZTO(GaZnSnO)-based oxide semiconductor material that does not contain In.

According to one embodiment of the present disclosure, the second semiconductor layer 133 may have a thickness of 3 nm to 30 nm. If the thickness of the second semiconductor layer 133 is too thin, film stability of the second semiconductor layer 133 is deteriorated, and it is difficult to form a uniform film. Therefore, the second semiconductor layer 133 may have a thickness of 3 nm or more.

On the other hand, if the thickness of the second semiconductor layer 133 becomes thicker than necessary, a variable width of a threshold voltage of the thin film transistor that includes the second semiconductor layer 133 may be increased, then the second semiconductor layer 133 may have a thickness of 30 nm or less. In more detail, the second semiconductor layer 133 may have a thickness of 5 nm to 15 nm.

According to one embodiment of the present disclosure, the first semiconductor layer 131 and the second semiconductor layer 133 may be formed by metal-organic chemical vapor deposition (MOCVD). The first semiconductor layer 131 and the second semiconductor layer 133 having a uniform surface and a thin stable film characteristic may be formed by the MOCVD.

Also, if the first semiconductor layer 131 and the second semiconductor layer 133 are formed by the MOCVD, a boundary between the first semiconductor layer 131 and the second semiconductor layer 133 is distinguished, and a thickness of a mixture area formed between the first semiconductor layer 131 and the second semiconductor layer 133 is reduced. As a result, an effective thickness reduction of the first semiconductor layer 131 and the second semiconductor layer 133 is minimized, whereby the first semiconductor layer 131 and the second semiconductor layer 133 may perform their unique functions even though the first semiconductor layer 131 and the second semiconductor layer 133 may be thin.

If the first semiconductor layer 131 and the second semiconductor layer 133 are formed by MOCVD, the first semiconductor layer 131 and the second semiconductor layer 133 may sequentially be formed by a continuous process without vacuum braking. As a result, process cost may be reduced, and stability of the process may be improved. As shown in FIG. 4, the semiconductor 130 is formed in a three-layered structure comprising the first semiconductor layer 131, the second semiconductor layer 133 formed on the first semiconductor layer 131, and the third semiconductor layer 135 formed on the second semiconductor layer 133.

At this time, one side of each of the first to third semiconductor layers 131, 133 and 135 faces the first conductor portion 171 by interposing the first insulating film 160, and the other side of each of the first to third semiconductor layers 131, 133 and 135 faces the second conductor portion 173 by interposing the first insulating film 160. In order to form the MIS contact structure, the first insulating film 160 is directly in contact with one side of each of the first to third semiconductor layers 131, 133 and 135 and one side of the first conductor portion 171, and is directly in contact with the other side of each of the first to third semiconductor layers 131, 133 and 135 and one side of the second conductor portion 173.

Since the first and second semiconductor layers 131 and 133 have the same characteristics as those of the first and second semiconductor layers 131 and 133 shown in FIG. 2, their detailed description will be omitted.

The third semiconductor layer 135 is intended to form an interface with the gate insulating film 140 to improve reliability, and may be formed of an oxide film (e.g., IGZO, etc.), which may perform an anti-oxidation function, at a minimum thickness (e.g., 3 nm or less) capable of performing the function.

The third semiconductor layer 135, for example, may include at least one of Ga based oxide semiconductors such as IGO(InGaO)-, IGZO(InGaZnO)-, IGZTO (InGaZnSnO)-, IGTO (InGaSnO)-, GO(GaO)-, GZTO(GaZnSnO)-, and GZO(GaZnO)-based oxide semiconductor materials.

In order to have excellent film stability, the third semiconductor layer 135 includes Ga of 40 atomic % (at %) or more based on the number of atoms in comparison with all metal atoms of the third semiconductor layer 135.

According to one embodiment of the present disclosure, all metal atoms of the third semiconductor layer 135 may be Ga. In this case, the third semiconductor layer 135 may be made of a GO(GaO) based oxide semiconductor material, and the content of Ga of all metal atoms in the third semiconductor layer 135 may be 100 at %.

In the same manner as the first semiconductor layer 131 and the second semiconductor layer 133, the third semiconductor layer 135 may be formed by metal-organic chemical vapor deposition (MOCVD). In this case, the first semiconductor layer 131, the second semiconductor layer 133 and the third semiconductor layer 135 may sequentially be formed by a continuous process without vacuum braking. In this way, the first semiconductor layer 131 may be formed to be thicker than the second semiconductor layer 133, and the second semiconductor layer 133 may be formed to be thicker than the third semiconductor layer 135. The thickness of the first semiconductor layer 131, the thickness of the second semiconductor layer 133, and the thickness of the third semiconductor layer 135 may be varied depending on a total thickness of the semiconductor 130, the characteristic of the first semiconductor layer 131, the characteristic of the second semiconductor layer 133, and the characteristic of the third semiconductor layer 135.

Preferably, the second semiconductor layer 133 is formed of a material having a carrier concentration higher than that of the first semiconductor layer 131.

The gate insulating film 140 and the gate electrode 150 may be formed of the same material as that of the gate insulating film and the gate electrode, which are applied to a general oxide TFT.

In accordance with the embodiment, the gate insulating film 140 may include an inorganic film, for example, at least one of SiOx and SiNx, or may include $Al_2O_3$, and may have a single film structure or multi-layered film structure.

In accordance with the embodiment, the gate electrode 150 may include at least one of Al based metal such as Al or Al alloy, Ag based metal such as Ag or Ag alloy, Cu based metal such as Cu or CU alloy, Mo based metal such as Mo or Mo alloy, Cr, Ta, Nd and Ti, and may be formed of a single layer or a multi-layer of two or more layers.

The first insulating film 160 is fully formed on the buffer layer 120 or the substrate 110 if the buffer layer 120 is not formed, and may be formed to cover at least a side of the semiconductor 130.

In this case, the side of the semiconductor 130 may include a side (first side) facing the first conductor portion 171 and a side (second side) facing the second conductor portion 173.

That is, the first insulating film 160 may be formed between the semiconductor 130 and the first conductor portion 171 and between the semiconductor 130 and the second conductor portion 173.

The first insulating film 160, for example, may be formed by an atomic layer deposition (ALD), and may be formed of a dielectric material (e.g., $SiO_2$, $Al_2O_3$, SiNx, HfOx, $ZrO_2$, $Ta_2O_3$, $Y_2O_3$, $SrTiO_3$, $SrTa_2O_6$, etc.) that may be formed by the ALD but is not limited to this embodiment.

The first insulating film 160 may be formed by Metal-Organic Chemical Vapor Deposition (MOCVD). In more detail, the first insulating film 160 may be formed by ALD using MOCVD.

Although FIG. 2 shows that the first insulating film 160 is formed to cover a side and an upper surface (specifically, an upper area exposed as the gate electrode 150 is not formed) of the gate insulating film 140 and also cover a side and an upper surface of the gate electrode 150, the first insulating film 160 may not be formed on the side and the upper surface of the gate insulating film 140 and the side and the upper surface of the gate electrode 150.

That is, the first insulating film 160 may be formed to cover the area where the semiconductor 130 of the buffer layer 120 is not formed or the area where the semiconductor 130 of the substrate 110 is not formed in the case that the buffer layer 120 is not formed, the side of the semiconductor 130 and a lower surface (specifically, a lower area exposed due to non-contact with the gate electrode 150) of the gate insulating film 140.

Therefore, as shown in FIG. 2, the first gate insulating film 160 may be formed between the upper surface of the first conductor portion 171 and the lower surface of the gate insulating film 140 and between the upper surface of the second conductor portion 173 and the lower surface of the gate insulating film 140.

In this case, the side of the gate insulating film 140 and the side of the gate electrode 150 correspond to the side of the semiconductor 130 in each of the gate insulating film 140 and the gate electrode 150.

Since the first insulating film 160 is formed between the semiconductor 130 and the first conductor portion 171 and between the semiconductor 130 and the second conductor portion 173, the first conductor portion 171, the first insulating film 160 and the semiconductor 130 may form a metal insulator semiconductor (MIS) contact structure, and the second conductor portion 173, the first insulating film 160 and the semiconductor 130 may form a MIS contact structure.

Since the first insulating film 160 is formed between the semiconductor 130 and the first conductor portion 171 and between the semiconductor 130 and the second conductor portion 173, hydrogen diffusion between the semiconductor 130 and the first conductor portion 171 and hydrogen diffusion between the semiconductor 130 and the second conductor portion 173 may be avoided, whereby the first insulating film 160 may be considered as a 'hydrogen diffusion prevention film'.

Since the thickness of the first insulating film 160 may be adjusted in various ways depending on the characteristic of the material used as the first insulating film 160, it is not limited to a specific value. However, the first insulating film 160 may be formed at a thickness that does not disturb carrier movement while preventing hydrogen diffusion from occurring from the conductor portions 171 and 173 to the semiconductor 130, and may be formed at a proper thickness that may form the MIS contact among the first conductor portion 171, the first insulating film 160 and the semiconductor 130 and the MIS contact among the second conductor portion 173, the first insulating film 160 and the semiconductor 130. Preferably, the first insulating film 160 may be formed at a thickness of 30 Å or less. A first region of first insulating film 160 between the semiconductor 130 and the first conductor portion 171, and a second region of insulating film 160 between the semiconductor 130 and the second conductor portion 173 may be formed at a thickness of 30 Å or less.

The first conductor portion 171 and the second conductor portion 173 are used as the source and drain areas and formed on the first insulating film 160, the first conductor portion 171 is formed to face the first side of the semiconductor 130 and the second conductor portion 173 is formed to face the second side of the semiconductor 130, whereby the first conductor portion 171 and the second conductor portion 173 may be formed to face each other based on the semiconductor 130.

In detail, one side of the first conductor portion 171 may be in contact with the first insulating film 160 arranged at the first side of the semiconductor 130, and one side of the second conductor portion 173 may be in contact with the first insulating film 160 arranged at the second side of the semiconductor 130.

The first and second conductor portions 171 and 173 may be formed of, but not limited to, IZO(InZnO)-based material. The first and second conductor portions 171 and 173 may include other oxide semiconductor material, for example, at least one of IGO(InGaO)-, ITO(InSnO)-, IGZO (InGaZnO)-, IGZTO(InGaZnSnO)-, ITZO(InSnZnO)-, IGTO(InGaSnO)-, GO(GaO)-, GZTO(GaZnSnO)-, ZTO (ZnSnO)- and GZO(GaZnO)-based oxide semiconductors.

However, the first and second conductor portions 171 and 173 are preferably formed of a material having resistance relatively lower than that of the semiconductor 130 to reduce conductorized resistance, so that a short channel may easily be embodied.

Although the first conductor portion 171 may be used as the source area of the thin film transistor 100 and the second conductor portion 173 may be used as the drain area of the thin film transistor 100, the first conductor portion 171 may be used as the drain area of the thin film transistor 100 and the second conductor portion 173 may be used as the source area of the thin film transistor 100.

The second insulating film 180 is fully formed on the buffer layer 120 to cover the first insulating film 160, the first conductor portion 171 and the second conductor portion 173, and may be used as an inter-layer dielectric (ILD) film.

For example, the second insulating film 180 may be formed of an inorganic insulating material such as SiOx, SiNx and AlOx in a single layered structure or multi-layered structure, or may be formed of an organic insulating material.

The first electrode 191 may be formed on the second insulating film 180 and connected with the first conductor portion 171 through a first contact hole H1 formed in the second insulating film 180, and the second electrode 193 may be formed on the second insulating film 180 and connected with the second conductor portion 173 through a second contact hole H2 formed in the second insulating film 180.

Each of the first and second electrodes 191 and 193 may be formed of a single layer or multi-layer made of any one of Mo, Al, Cr, W, Ti, Ni, Nd and Cu or their alloy.

In this way, since the first insulating film 160 serving as a hydrogen diffusion prevention film is formed between the semiconductor 130 used as a channel and the first and second conductor portions 171 and 173 used as source and drain areas, hydrogen diffusion from the first and second conductor portions 171 and 173 to the semiconductor 130 may be avoided.

Also, the first insulating film 160 of the present disclosure may not only prevent hydrogen diffusion from the first and second conductor portions 171 and 173 to the semiconductor 130 but also prevent hydrogen diffusion from the insulating film or organic film formed by a process subsequent to the process of forming the second insulating film 180 or the first and second electrodes 191 and 193 to the semiconductor 130.

Therefore, since a diffusion area is not formed between the semiconductor 130 and the first conductor portion 171 and between the semiconductor 130 and the second conductor portion 173, degradation caused by the diffusion area may be avoided, whereby the short channel may be embodied and reliability of the thin film transistor may be improved.

Also, since the first and second conductor portions 171 and 173 are formed of a material having resistance relatively lower than that of the semiconductor 130, conductorized resistance may be reduced, whereby the short channel may be embodied more easily.

The structure of the thin film transistor according to the embodiment of the present disclosure has been described as above with reference to FIGS. 1 to 4. Hereinafter, a method for manufacturing a thin film transistor according to the embodiment of the present disclosure will be described with reference to FIGS. 5A to 5L.

FIGS. 5A to 5L are views illustrating a method for manufacturing a thin film transistor according to one embodiment of the present disclosure.

Figure 5A:
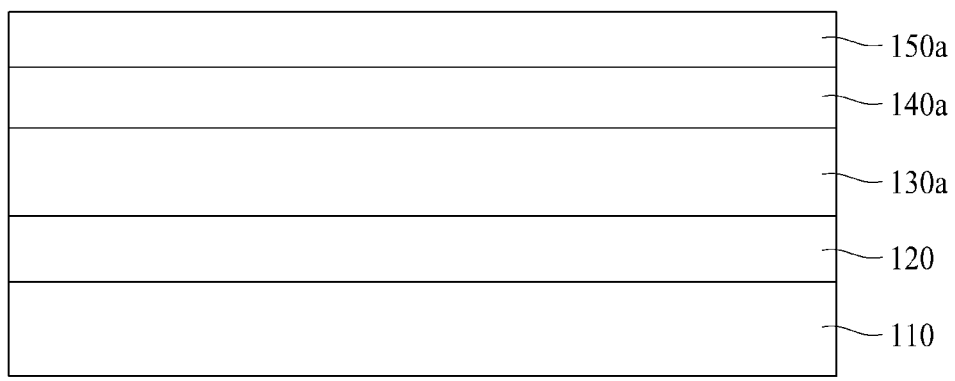
FIGS. 5A to 5L are views illustrating a method for manufacturing a thin film transistor according to the embodiment of the present disclosure.
Figure 5B:
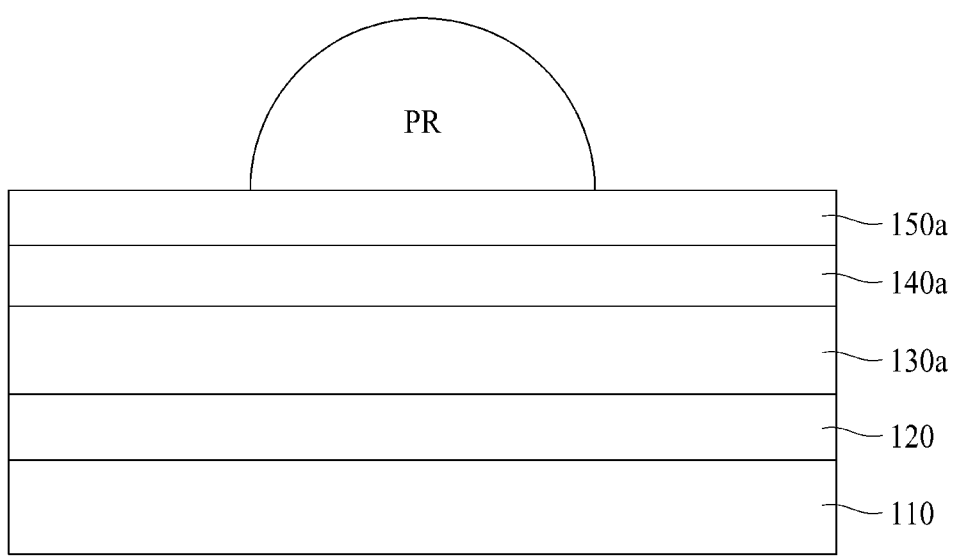

First of all, as shown in FIG. 5A, a first semiconductor material layer 130a, a gate insulating film material layer 140a and a gate electrode material layer 150a are sequentially deposited on the buffer layer 120 formed on the substrate 110 to form the semiconductor 130, the gate insulating film 140 and the gate electrode 150.

For example, IGZO, etc. may be used as the first semiconductor material, and SiOx, SiNx, etc. may be used as the gate insulating film material. Metal such as Al, Ag, Cu, Mo, Cr, Ta, and Ti or their alloy may be used as the gate electrode material.

Unlike FIG. 5A, the first semiconductor material layer 130a, the gate insulating film material layer 140a and the gate electrode material layer 150a may sequentially be deposited on the substrate 110.

Hereinafter, the structure that the thin film transistor 100 includes the buffer layer 120 will be described as an example, but the method for manufacturing a thin film transistor, which will be described later, may equally be applied to the case that the thin film transistor 100 does not include a buffer layer 120.

Also, although FIG. 5A shows that the semiconductor 130 is formed in a single layer, the semiconductor 130 may be formed in a multi-layer as shown in FIGS. 3 and 4.

If the semiconductor 130 is formed in a two-layered structure as shown in FIG. 3, deposition of the first semiconductor material layer 130a may include sequentially depositing a material layer for forming the first semiconductor layer 131 and a material layer for forming the second semiconductor layer 133.

At this time, the material layer for forming the first semiconductor layer may be made of a material having a carrier concentration lower than that of the material layer for forming the second semiconductor layer, and may be deposited to be thicker than the material layer for forming the second semiconductor layer.

If the semiconductor 130 is formed in a three-layered structure as shown in FIG. 4, deposition of the first semiconductor material layer 130a may include sequentially depositing a material layer for forming the first semiconductor layer 131, a material layer for forming the second semiconductor layer 133 and a material layer for forming the third semiconductor layer 135.

At this time, the material layer for forming the first semiconductor layer may be deposited to be thicker than the material layer for forming the second semiconductor layer, and the material layer for forming the second semiconductor layer may be deposited to be thicker than the material layer for forming the third semiconductor layer.

Afterwards, as shown in FIGS. 5B to 5F, the patterned semiconductor 130, the gate insulating film 140 and the gate electrode 150 are formed.

Figure 5C:
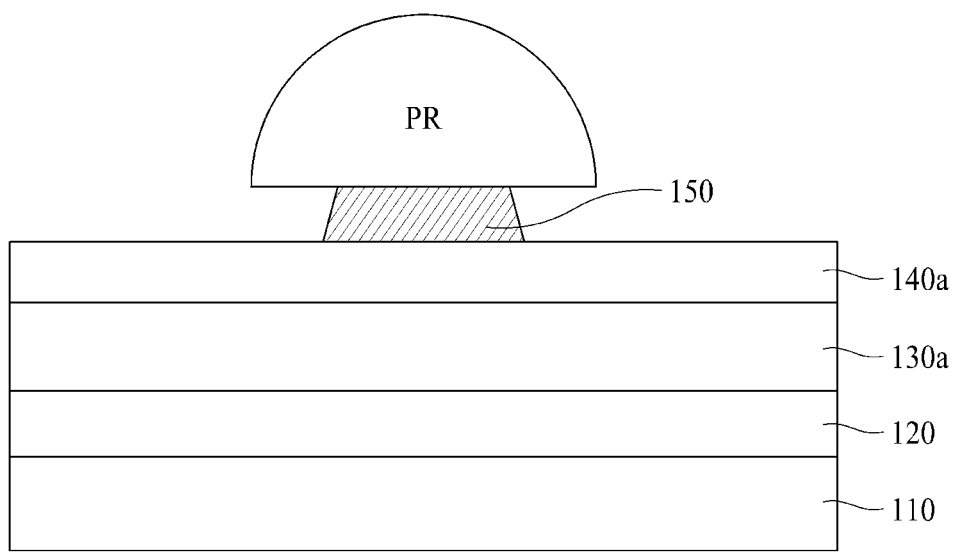
Figure 5D:
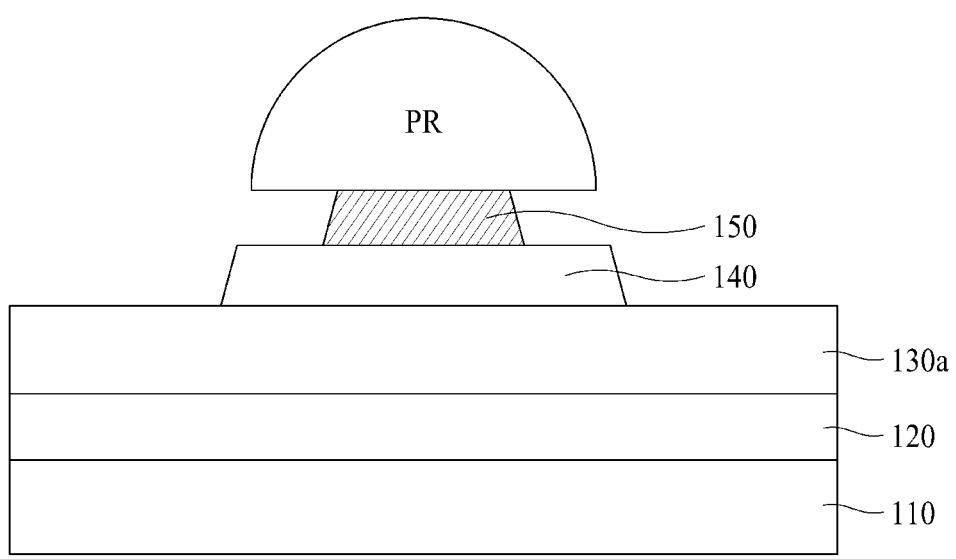
Figure 5E:
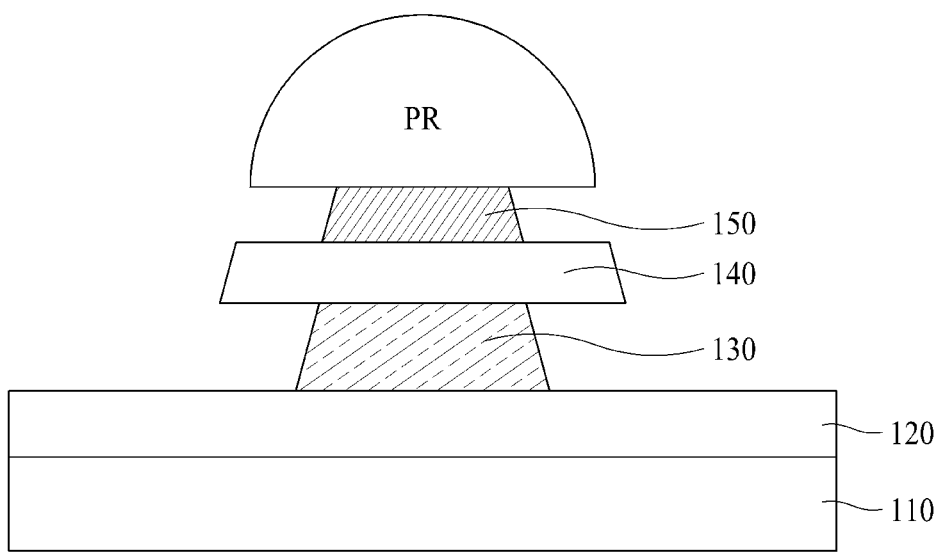
Figure 5F:
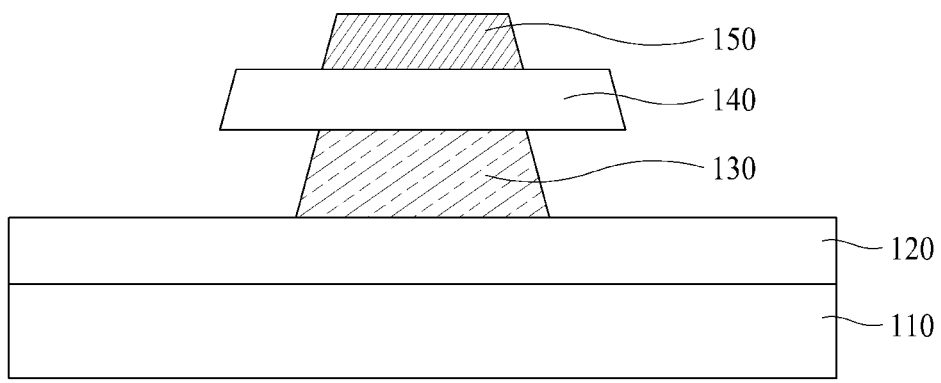

In detail, a photoresist PR is formed to be patterned on the gate electrode material layer 150a (FIG. 5B), and the gate electrode material layer 150a is patterned through a wet etching using the photoresist pattern as a mask to form the gate electrode 150 (FIG. 5C). The gate insulating film material layer 140a is patterned through a dry etching using the photoresist pattern as a mask to form the gate insulating film 140 (FIG. 5D), and the first semiconductor material layer 130a is patterned through a wet etching using the photoresist pattern as a mask to form the semiconductor 130 (FIG. 5E) and then the photoresist pattern is removed (FIG. 5F).

Figure 5G:
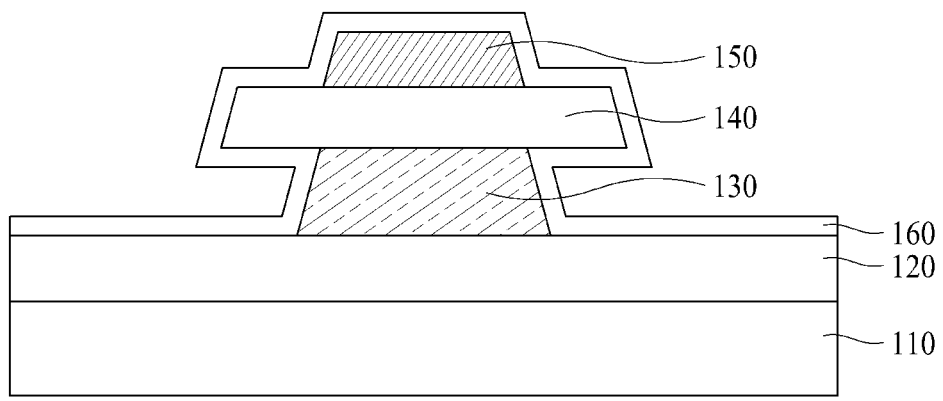

Afterwards, as shown in FIG. 5G, the first insulating film 160 is formed on the buffer layer 120 where the patterned semiconductor 130, the gate insulating film 140 and the gate electrode 150 are sequentially formed.

The first insulating film 160 is formed to be directly in contact with one side and the other side of the semiconductor 130. If the semiconductor 130 is provided in a two-layered structure that includes the first and second semiconductor layers 131 and 133 as shown in FIG. 3, the first insulating film 160 is formed to be in contact with one side of each of the first and second semiconductor layers 131 and 133 and the other side of each of the first and second semiconductor layers 131 and 133.

If the semiconductor 130 is provided in a three-layered structure that includes the first to third semiconductor layers 131, 133 and 135 as shown in FIG. 4, the first insulating film 160 is formed to be in contact with one side of each of the first to third semiconductor layers 131, 133 and 135 and the other side of each of the first to third semiconductor layers 131, 133 and 135.

The first insulating film 160 may be formed by, but not limited to, atomic layer deposition (ALD). The first insulating film 160 may be formed by Metal-Organic Chemical Vapor Deposition (MOCVD). In more detail, the first insulating film 160 may be formed by ALD using MOCVD.

Therefore, the first insulating film 160 may be formed to cover the exposed upper surface of the buffer layer 120, the exposed side of the semiconductor 130, the exposed lower surface, side and upper surface of the gate insulating film 140, and the exposed side and upper surface of the gate electrode 150.

Unlike this embodiment, the first insulating film 160 may not be formed on the side and upper surface of the gate insulating film 140 and the side and upper surface of the gate electrode 150 in accordance with the process.

That is, the first insulating film 160 may be formed to cover the exposed upper surface of the buffer layer 120, the exposed side of the semiconductor 130 and the exposed lower surface of the gate insulating film 140.

Figure 5H:
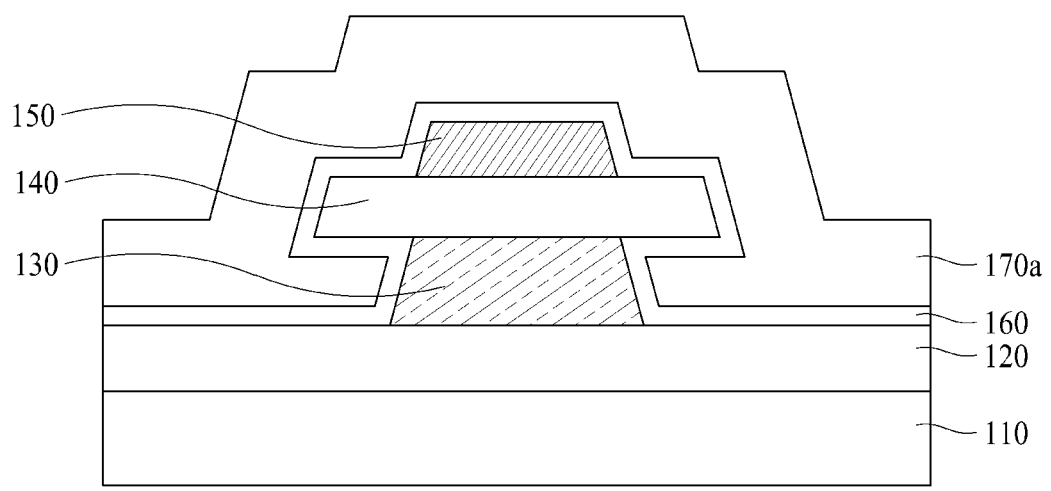
Figure 5I:
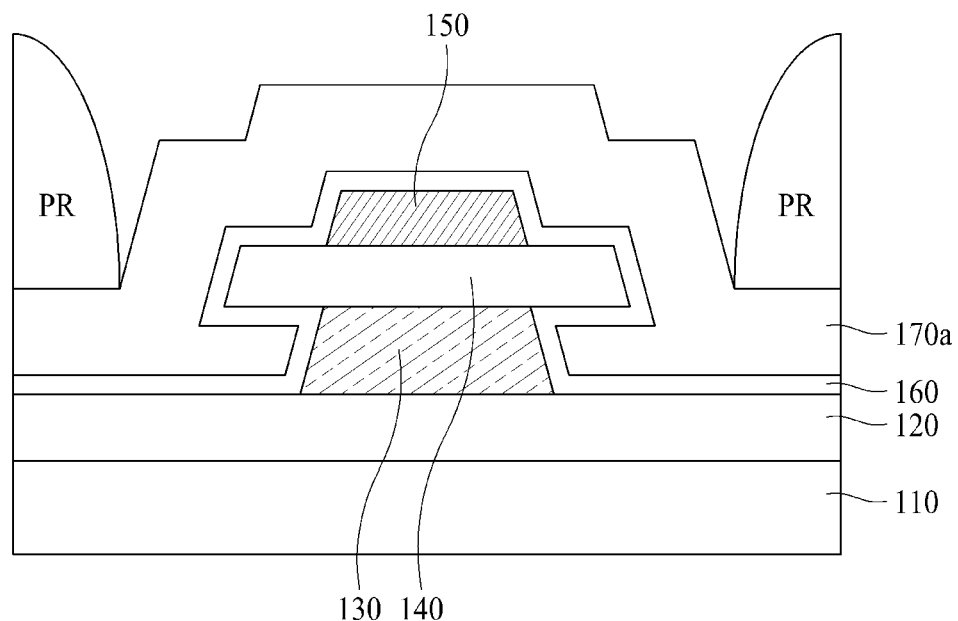
Figure 5J:
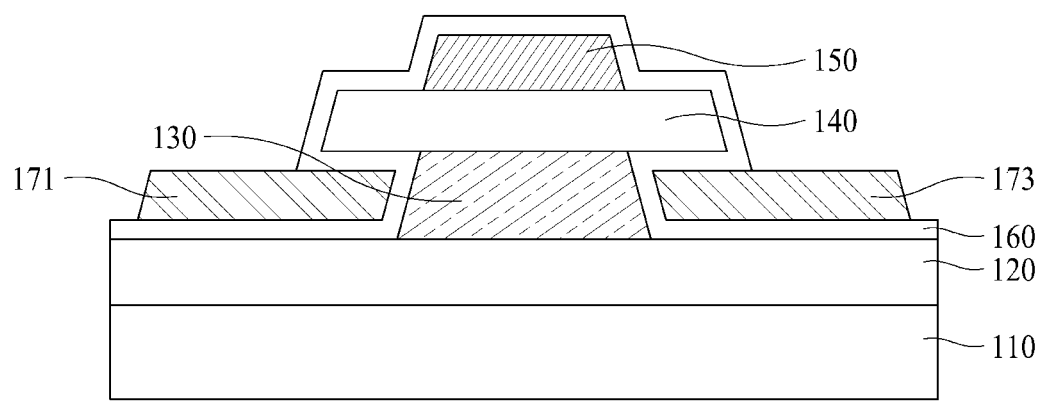

Afterwards, as shown in FIGS. 5H to 5J, the first and second conductor portions 171 and 173 are formed on the first insulating film 160.

In detail, as shown in FIG. 5H, the second semiconductor material layer 170a is fully deposited on the first insulating film 160, and the second semiconductor material layer 170a is conductorized by plasma treatment or hydrogen treatment performed in the middle of depositing the second semiconductor layer 170a.

For example, IZO, etc. may be used as the second semiconductor material, and the second semiconductor material layer 170a may be deposited by MOCVD. However, the type of the second semiconductor material and the method for depositing the second semiconductor material layer 170a are not limited to this embodiment. After the second semiconductor material layer 170a is deposited, the photoresist PR is patterned on the second semiconductor material layer 170a (FIG. 5I), and the second semiconductor material layer 170a is patterned through wet etching using the photoresist pattern as a mask to form the first and second conductor portions 171 and 173 and then the photoresist pattern is removed (FIG. 5J).

Therefore, the first conductor portion 171 is formed at one side of the semiconductor 130 by using the first insulating film 160 formed at one side of the semiconductor 130 as a boundary, and the second conductor portion 173 is formed at the other side of the semiconductor 130 by using the first insulating film 160 formed at the other side of the semiconductor 130 as a boundary.

Therefore, one side of the first conductor portion 171 is directly in contact with the first insulating film 160 formed at one side of the semiconductor 130, and one side of the second conductor portion 173 is directly in contact with the first insulating film 160 formed at the other side of the semiconductor 130.

In detail, one side of the first conductor portion 171 is directly in contact with a first portion of the first insulating film 160 formed to be in contact with one side of the semiconductor 130, and one side of the second conductor portion 173 is directly in contact with a second portion of the first insulating film 160 formed to be in contact with the other side of the semiconductor 130.

Figure 5K:
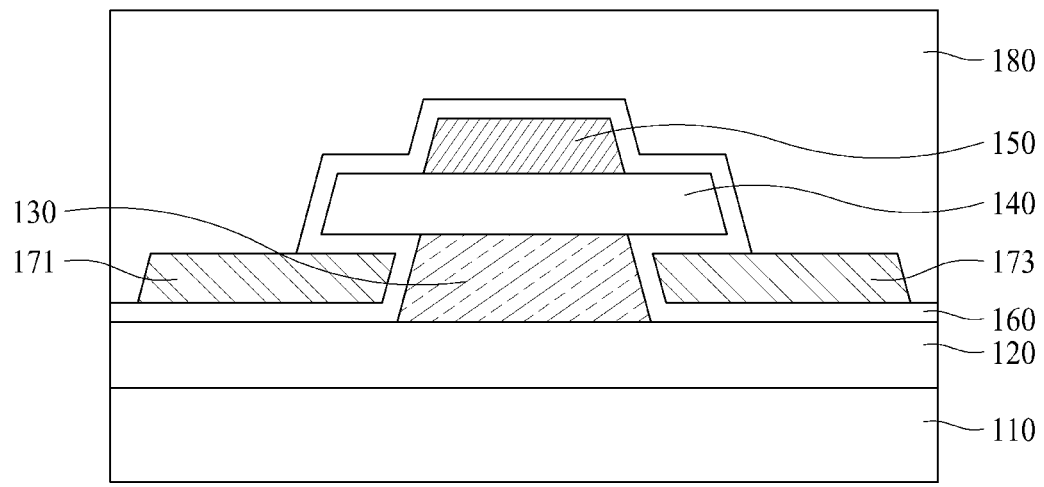

Afterwards, as shown in FIG. 5K, the second insulating film 180 is fully formed on the buffer layer 120, whereby the second insulating film 180 covers the first insulating film 160, the first conductor portion 171 and the second conductor portion 173.

Figure 5L:
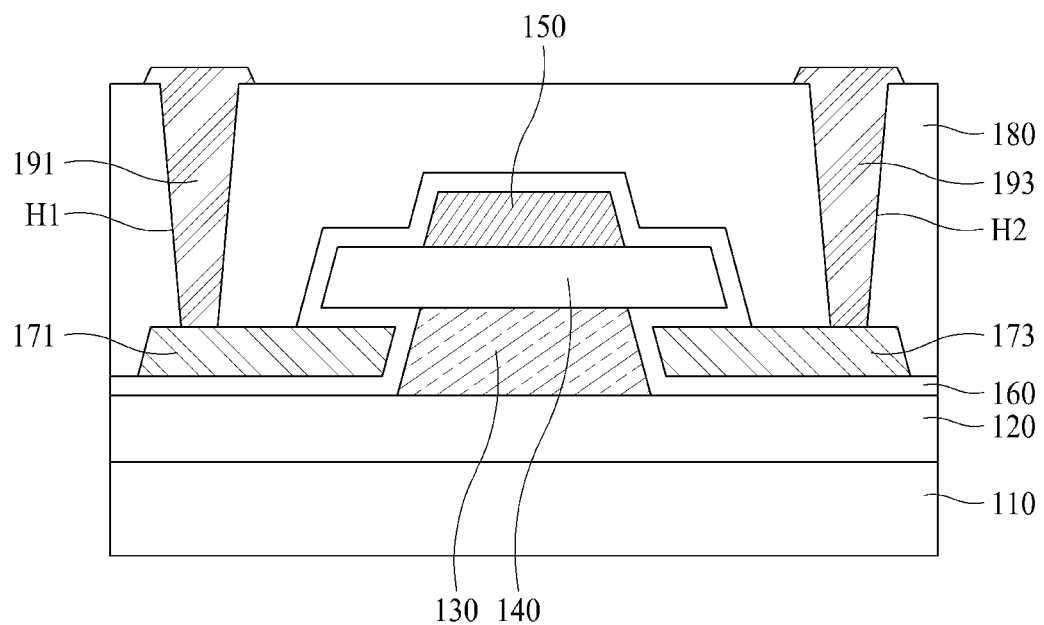

Afterwards, as shown in FIG. 5L, the first contact hole H1 connected with the first conductor portion 171 and the second contact hole H2 connected with the second conductor portion 173 are formed in the second insulating film 180, and the first electrode 191 connected with the first conductor portion 171 through the first contact hole H1 and the second electrode 193 connected with the second conductor portion 173 through the second contact hole H2 are formed on the second insulating film 180.

The second insulating film 180 may be formed on the buffer layer 120 to cover the first insulating film 160, the first conductor portion 171 and the second conductor portion 173.

For example, the second insulating film 180 may be formed of an inorganic insulating material such as SiOx, SiNx and AlOx in a single layered structure or multi-layered structure, or may be formed of an organic insulating material.

Figure 6:
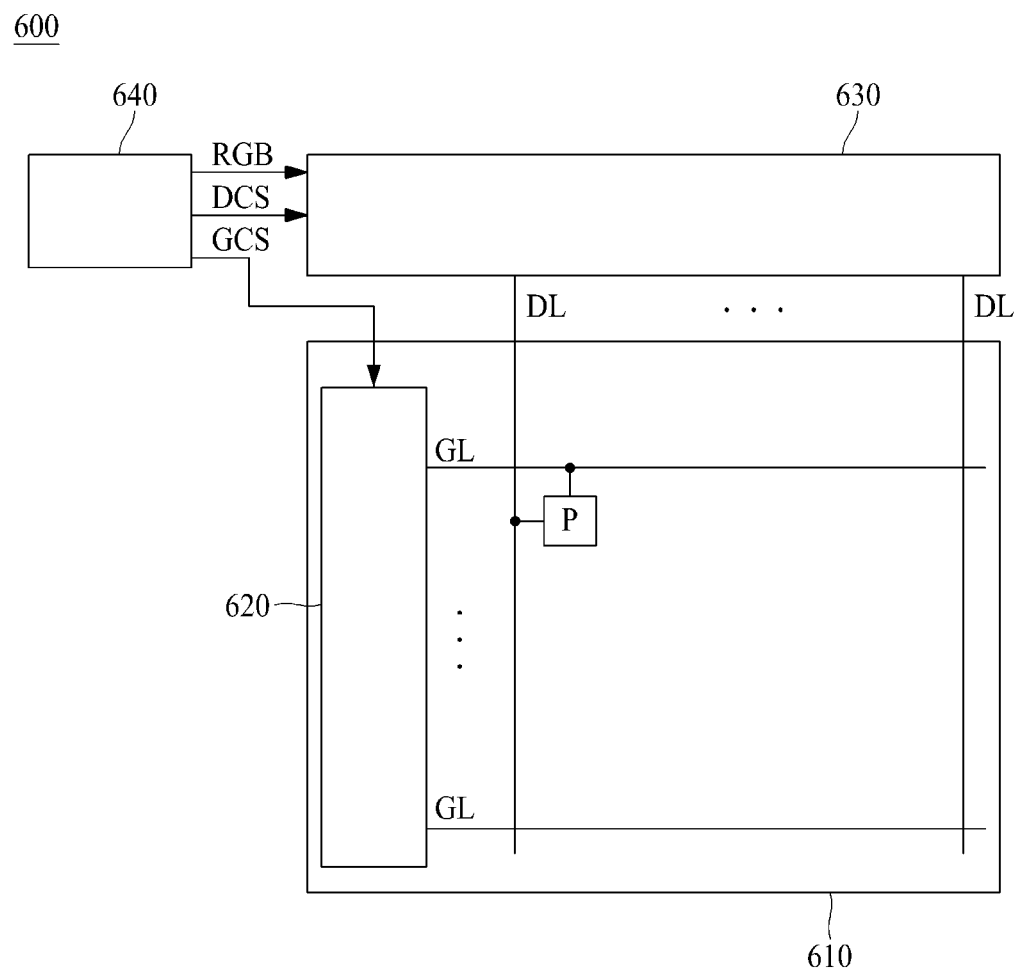
FIG. 6 is a schematic view illustrating a display apparatus comprising a thin film transistor according to the embodiment of the present disclosure.
Figure 7:
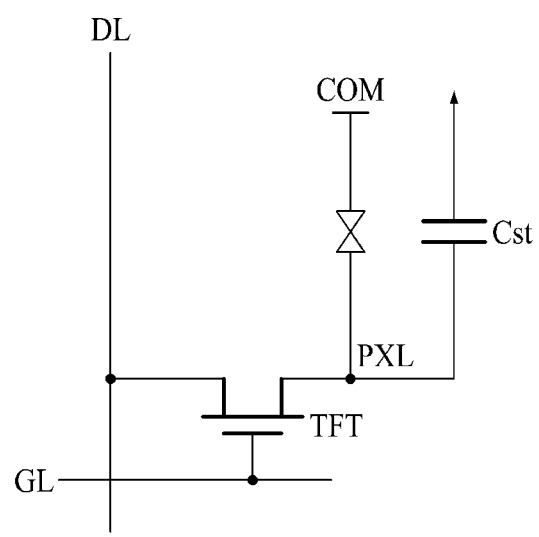
FIG. 7 is a view illustrating an example of a circuit structure for one pixel P included in a display panel of FIG. 6.
Figure 8:
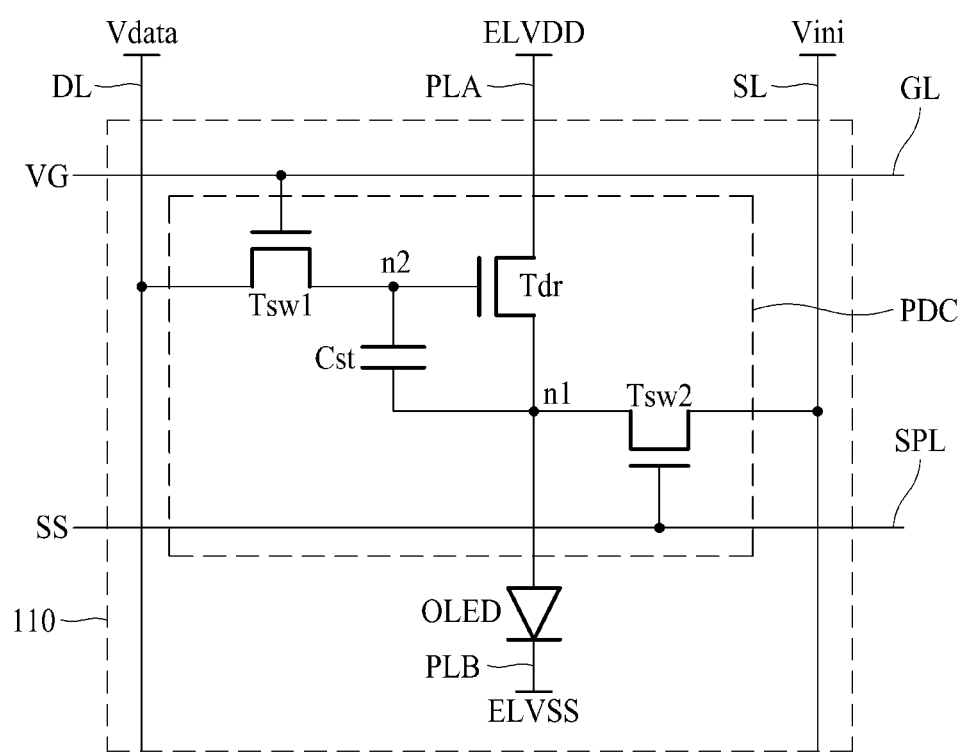
FIG. 8 is a view illustrating another example of a circuit structure for one pixel P included in a display panel of FIG. 6.

FIG. 6 is a schematic view illustrating a display apparatus comprising a thin film transistor according to the embodiment of the present disclosure, FIG. 7 is a view illustrating an example of a circuit structure for one pixel P included in a display panel of FIG. 6, and FIG. 8 is a view illustrating another example of a circuit structure for one pixel P included in a display panel of FIG. 6.

Referring to FIG. 6, the display apparatus 600 according to the embodiment of the present disclosure may include a display panel 610, a gate driver 620, a data driver 630, and a controller 640.

Gate lines GL and data lines DL may be disposed in the display panel 610, pixels P may be disposed in an intersection area of the gate lines GL and the data lines DL, and at least one thin film transistor 100 according to the embodiment of the present disclosure may be included in each of the pixel P.

The gate driver 620 is controlled by a controller 640, and sequentially supplies gate pulses GP, which may turn on a switching element, to the gate lines GL for one frame. In this case one frame means a time period when one image is output through the display panel 610.

Also, the gate driver 620 supplies gate off signals Goff, which may turn off the switching element, to the gate lines GL for the other time period of one frame, the gate pulses are not supplied for the other time period. Hereinafter, the gate pulses GP and the gate off signals Goff will collectively be referred to as scan signals SS.

The gate driver 620, as shown in FIG. 6, may be packaged in the display panel 610. In this way, a structure that the gate driver 620 is directly packaged in the display panel 610 will be referred to as a gate in panel (GIP) structure.

The gate driver 620 may be packaged in the other structure outside the display panel 610, may be packaged in only one side of the display panel 610, or may be packaged in both sides of the display panel 610.

The data driver 630 converts image data RGB input from the controller 640 to analog data voltages, and supplies data voltages Vdata of one horizontal line to the data lines DL per one horizontal period for supplying the gate pulses GP to the gate lines GL, whereby each pixel P display brightness based on the image data.

The controller 640 may output gate control signals GCS for controlling the gate driver 620 and data control signals DCS for controlling the data driver 630 by using various timing signals (ex., vertical synchronization signal, horizontal synchronization signal, clock signal, etc.) supplied from an external system (not shown).

Also, the controller 640 may samples input image data input from the external system, realigns the sampled image data and supply the realigned image data RGB to the data driver 630.

Each of the pixels P included in the display panel 610 may include at least one thin film transistor according to the embodiment of the present disclosure.

The display panel 610 may be a liquid crystal display panel applied to a liquid crystal display apparatus or an organic light emitting display panel applied to an organic light emitting display apparatus.

If the display panel 610 is a liquid crystal display panel, each pixel P included in the display panel 610 may include at least one thin film transistor TFT used as a switching element for driving a liquid crystal.

As shown in FIG. 7, the thin film transistor TFT according to the embodiment of the present disclosure, which is connected between the data line DL and a pixel electrode PXL, may be provided in the pixel P, and a gate terminal of the thin film transistor TFT may be connected with the gate line GL.

A refractive index of the liquid crystal may be changed by a data voltage supplied to the pixel electrode PXL and a common voltage supplied to a common electrode COM, whereby light transmittance of the liquid crystal may be changed, and brightness of light may be controlled by control of light transmittance. In this case, storage capacitance Cst for maintaining the data voltage is formed between the pixel electrode PXL and the common electrode COM.

If the display panel 610 is an organic light emitting display panel, each pixel P included in the display panel 610, as shown in FIG. 8, may include an organic light emitting diode OLED for outputting light, and a pixel driving circuit PDC for driving the organic light emitting diode OLED.

Signal lines DL, GL, PLA, PLB, SL and SPL for supplying a driving signal to the pixel driving circuit PDC may be formed in the pixel P.

The pixel driving circuit PDC may include a switching transistor Tsw1 connected to the gate and data lines GL and DL, a driving transistor Tdr for controlling a size of a current output to the organic light emitting diode OLED in accordance with the data voltage Vdata transmitted through the switching transistor Tsw1, and a sensing transistor Tsw2 for sensing a characteristic of the driving transistor Tdr. The sensing transistor Tsw2, the driving transistor Tdr and the organic light emitting diode OLED are connected with the first node n1. The switching transistor Tsw1, the driving transistor Tdr and the capacitor Cst are connected with the second node n2. The driving transistor Tdr is connected with a high potential voltage source ELVDD through a high potential voltage supply line PLA. The organic light emitting diode OLED is connected with a low potential voltage source ELVSS through a low potential voltage supply line PLB. The sensing transistor Tsw2 is connected with an initialization voltage Vini through an initialization voltage supply line SL.

A gate pulse and a gate low signal are supplied to the gate line GL, and are collectively referred to as a gate signal VG.

A scan pulse and a scan low signal are supplied to a scan pulse line SPL connected with a gate of the sensing transistor Tsw2, and are collectively referred to as a scan control signal SS.

The switching transistor Tsw1, the driving transistor Tdr and the sensing transistor Tsw2 may be the oxide thin film transistors according to the embodiment of the present disclosure.

The pixel driving circuit PDC may further include other transistors in addition to the transistors Tsw1, Tdr and Tsw2. The transistors further provided in the pixel driving circuit PDC may be the oxide thin film transistors according to the embodiment of the present disclosure.

A thin film transistor, a method for manufacturing the same and a display apparatus comprising the same according to an embodiment of the present disclosure will be described below A thin film transistor according to an embodiment of the present disclosure may comprise a semiconductor formed on a substrate, a gate insulating film formed on the semiconductor, a gate electrode formed on the gate insulating film, a first insulating film formed on the substrate, a first conductor portion formed on the first insulating film and formed at one side of the semiconductor, and a second conductor portion formed on the first insulating film and formed at another side of the semiconductor, wherein a first portion of the first insulating film may be formed between the semiconductor and the first conductor portion, and a second portion of the first insulating film may be formed between the semiconductor and the second conductor portion.

According to an embodiment of the present disclosure, the first portion of the first insulating film may be directly in contact with the one side of the semiconductor and one side of the first conductor portion, and the second portion of the first insulating film may be directly in contact with another side of the semiconductor and one side of the second conductor portion.

According to an embodiment of the present disclosure, the semiconductor may include a first semiconductor layer, and a second semiconductor layer formed on the first semiconductor layer, wherein the first portion of the first insulating film may be formed between each of the first and second semiconductor layers and the first conductor portion, and the second portion of the first insulating film may be formed between each of the first and second semiconductor layers and the second conductor portion.

According to an embodiment of the present disclosure, the first portion of the first insulating film may be directly in contact with one side of each of the first and second semiconductor layers and one side of the first conductor portion, and the second portion of the first insulating film may be directly in contact with another side of each of the first and second semiconductor layers and one side of the second conductor portion.

According to an embodiment of the present disclosure, the first semiconductor layer may be formed of a material having a carrier concentration lower than that of the second semiconductor layer and formed to be thicker than the second semiconductor layer.

According to an embodiment of the present disclosure, the semiconductor may include a first semiconductor layer, a second semiconductor layer formed on the first semiconductor layer, and a third semiconductor layer formed on the second semiconductor layer, the first portion of the first insulating film may be formed between each of the first to third semiconductor layers and the first conductor portion, and the second portion of the first insulating film may be formed between each of the first to third semiconductor layers and the second conductor portion.

According to an embodiment of the present disclosure, the first portion of the first insulating film may be directly in contact with one side of each of the first to third semiconductor layers and one side of the first conductor portion, and the second portion of the first insulating film may be directly in contact with another side of each of the first to third semiconductor layers and one side of the second conductor portion.

According to an embodiment of the present disclosure, the first semiconductor layer may be formed to be thicker than the second semiconductor layer, and the second semiconductor layer may be formed to be thicker than the third semiconductor layer.

According to an embodiment of the present disclosure, the first insulating film may be further formed between an upper surface of the first conductor portion and a lower surface of the gate insulating film and between an upper surface of the second conductor portion and the lower surface of the gate insulating film.

According to an embodiment of the present disclosure, the first insulating film may be further formed to cover a side and an exposed upper surface of the gate insulating film and a side and an upper surface of the gate electrode.

According to an embodiment of the present disclosure, the thin film transistor may further comprise a second insulating film formed on the substrate to cover the first insulating film, the first conductor portion and the second conductor portion, a first electrode formed on the second insulating film and is in contact with the first conductor portion through a first contact hole formed in the second insulating film, and a second electrode formed on the second insulating film and is in contact with the second conductor portion through a second contact hole formed in the second insulating film.

According to an embodiment of the present disclosure, the first and second conductor portions may be formed of an oxide semiconductor material, and formed of a material having resistance lower than that of the semiconductor.

According to an embodiment of the present disclosure, the first insulating film may be formed at a thickness of 30 Å or less.

A method of manufacturing a thin film transistor according to an embodiment of the present disclosure may comprise the steps of: forming a semiconductor, a gate insulating film and a gate electrode, which are sequentially deposited on a substrate, forming a first insulating film on the substrate to cover at least a side of the semiconductor, and forming first and second conductor portions on the first insulating film to face each other at both sides of the semiconductor, wherein the step of forming the first and second conductor portions may include forming the first conductor portion at one side of the semiconductor by using the first insulating film formed at the one side of the semiconductor as a boundary and forming the second conductor portion at another side of the semiconductor by using the first insulating film formed at the another side of the semiconductor as a boundary.

According to an embodiment of the present disclosure, the step of forming the first insulating film may include forming the first insulating film to directly contact the one side of the semiconductor and directly contact the another side of the semiconductor.

According to an embodiment of the present disclosure, the step of forming the first and second conductor portions may include forming one side of the first conductor portion to directly contact the first insulating film formed at the one side of the semiconductor and forming one side of the second conductor portion to directly contact the first insulating film formed at the another side of the semiconductor.

According to an embodiment of the present disclosure, the step of forming the semiconductor may include sequentially depositing a first material layer for forming a first semiconductor layer and a second material layer for forming a second semiconductor layer on the substrate, and the first material layer is formed of a material having a carrier concentration lower than that of the second material layer and deposited to be thicker than the second material layer.

According to an embodiment of the present disclosure, the step of forming the semiconductor may include sequentially depositing a first material layer for forming a first semiconductor layer, a second material layer for forming a second semiconductor layer and a third material layer for forming a third semiconductor layer on the substrate, and the first material layer is deposited to be thicker than the second material layer, and the second material layer is deposited to be thicker than the third material layer.

According to an embodiment of the present disclosure, the step of forming the first insulating film may include forming the first insulating film to cover an exposed lower surface of the gate insulating film.

According to an embodiment of the present disclosure, the step of forming the first insulating film may include forming the first insulating film to cover a side of the gate insulating film, an exposed upper surface of the gate insulating film, and a side and an upper surface of the gate electrode.

The method according to an embodiment of the present disclosure may further comprise the steps of forming a second insulating film on the substrate to cover the first insulating film, the first conductor portion and the second conductor portion, forming a first contact hole connected with the first conductor portion and a second contact hole connected with the second conductor portion in the second insulating film, and forming a first electrode connected with the first conductor portion through the first contact hole and a second electrode connected with the second conductor portion through the second contact hole, on the second insulating film.

According to an embodiment of the present disclosure, the first and second conductor portions may be formed of an oxide semiconductor material, and formed of a material having resistance lower than that of the semiconductor.

According to an embodiment of the present disclosure, the first insulating film may be formed at a thickness of 30 Å or less.

A display apparatus according to an embodiment of the present disclosure may comprise a display panel including at least one thin film transistor for driving each of a plurality of pixels connected to gate and data lines, the thin film transistor may include a semiconductor formed on a substrate, a gate insulating film formed on the semiconductor, a gate electrode formed on the gate insulating film, a first insulating film formed on the substrate, a first conductor portion formed on the first insulating film and formed at one side of the semiconductor, and a second conductor portion formed on the first insulating film and formed at the other side of the semiconductor, wherein a first portion of the first insulating film may be formed between the semiconductor and the first conductor portion, and a second portion of the first insulating film may be formed between the semiconductor and the second conductor portion.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
a semiconductor formed on a substrate;
a gate insulating film formed on the semiconductor, a first part and a second part of the gate insulating film extending beyond the semiconductor;
a gate electrode formed on the gate insulating film;
a first insulating film formed on the substrate;
a first conductor portion formed on the first insulating film and formed at one side of the semiconductor; and
a second conductor portion formed on the first insulating film and formed at another side of the semiconductor,
wherein a first portion of the first insulating film is formed between the semiconductor and the first conductor portion under the first part of the gate insulating film extending beyond the semiconductor, and a second portion of the first insulating film is formed between the semiconductor and the second conductor portion under the second part of the gate insulating film extending beyond the semiconductor.

2. The thin film transistor of claim 1, wherein the first portion of the first insulating film is directly in contact with the one side of the semiconductor and one side of the first conductor portion, and the second portion of the first insulating film is directly in contact with the another side of the semiconductor and one side of the second conductor portion.

3. The thin film transistor of claim 1, wherein the first insulating film is further formed between an upper surface of the first conductor portion and a lower surface of the gate insulating film and between an upper surface of the second conductor portion and the lower surface of the gate insulating film.

4. The thin film transistor of claim 1, wherein the first insulating film is further formed to cover a side and an exposed upper surface of the gate insulating film and a side and an upper surface of the gate electrode.

5. The thin film transistor of claim 1, further comprising:
a second insulating film formed on the substrate to cover the first insulating film, the first conductor portion and the second conductor portion;
a first electrode formed on the second insulating film and is in contact with the first conductor portion through a first contact hole formed in the second insulating film; and
a second electrode formed on the second insulating film and is in contact with the second conductor portion through a second contact hole formed in the second insulating film.

6. The thin film transistor of claim 1, wherein the first and second conductor portions are formed of an oxide semiconductor material, and formed of a material having resistance lower than that of the semiconductor.

7. The thin film transistor of claim 1, wherein the first insulating film is formed at a thickness of 30 Å or less.

8. A display apparatus comprising a display panel including at least one thin film transistor for driving each of a plurality of pixels connected to gate and data lines, wherein the at least one thin film transistor is the thin film transistor of claim 1.

9. The thin film transistor of claim 1, wherein the semiconductor includes:
a first semiconductor layer; and
a second semiconductor layer formed on the first semiconductor layer,
wherein the first portion of the first insulating film is formed between each of the first and second semiconductor layers and the first conductor portion, and the second portion of the first insulating film is formed between each of the first and second semiconductor layers and the second conductor portion.

10. The thin film transistor of claim 9, wherein the first portion of the first insulating film is directly in contact with one side of each of the first and second semiconductor layers and one side of the first conductor portion, and the second portion of the first insulating film is directly in contact with another side of each of the first and second semiconductor layers and one side of the second conductor portion.

11. The thin film transistor of claim 9, wherein the first semiconductor layer is formed of a material having a carrier concentration lower than that of the second semiconductor layer and formed to be thicker than the second semiconductor layer.

12. The thin film transistor of claim 1, wherein the semiconductor includes:

a first semiconductor layer;
a second semiconductor layer formed on the first semiconductor layer; and
a third semiconductor layer formed on the second semiconductor layer,
wherein the first portion of the first insulating film is formed between each of the first to third semiconductor layers and the first conductor portion, and the second portion of the first insulating film is formed between each of the first to third semiconductor layers and the second conductor portion.

13. The thin film transistor of claim 12, wherein the first portion of the first insulating film is directly in contact with one side of each of the first to third semiconductor layers and one side of the first conductor portion, and the second portion of the first insulating film is directly in contact with another side of each of the first to third semiconductor layers and one side of the second conductor portion.

14. The thin film transistor of claim 12, wherein the first semiconductor layer is formed to be thicker than the second semiconductor layer, and the second semiconductor layer is formed to be thicker than the third semiconductor layer.

15. A method for manufacturing a thin film transistor, the method comprising the steps of:
forming a semiconductor, a gate insulating film and a gate electrode, which are sequentially deposited on a substrate, a first part and a second part of the gate insulating film formed to extend beyond the semiconductor;
forming a first insulating film on the substrate under the first and second parts of the gate insulating film extending beyond the semiconductor to cover at least a side of the semiconductor; and
forming first and second conductor portions on the first insulating film to face each other at both sides of the semiconductor,
wherein the first insulating film includes a first part and a second part,
wherein the first part of the first insulating film is formed at one side of the semiconductor under the first part of the gate insulating film,
wherein the second part of the first insulating film is formed at another side of the semiconductor under the second part of the gate insulating film, and
wherein the step of forming the first and second conductor portions includes forming the first conductor portion at the one side of the semiconductor by using the first part of the first insulating film as a boundary and forming the second conductor portion at the another side of the semiconductor by using the second part of the first insulating film as another boundary.

16. The method of claim 15, wherein the step of forming the first insulating film includes forming the first insulating film to directly contact the one side of the semiconductor and directly contact the another side of the semiconductor.

17. The method of claim 15, wherein the step of forming the first and second conductor portions includes forming one side of the first conductor portion to directly contact the first insulating film formed at the one side of the semiconductor and forming one side of the second conductor portion to directly contact the first insulating film formed at the another side of the semiconductor.

18. The method of claim 15, wherein the step of forming the semiconductor includes sequentially depositing a first material layer for forming a first semiconductor layer and a second material layer for forming a second semiconductor layer on the substrate, and the first material layer is formed of a material having a carrier concentration lower than that of the second material layer and deposited to be thicker than the second material layer.

19. The method of claim 15, wherein the step of forming the semiconductor includes sequentially depositing a first material layer for forming a first semiconductor layer, a second material layer for forming a second semiconductor layer and a third material layer for forming a third semiconductor layer on the substrate, and the first material layer is deposited to be thicker than the second material layer, and the second material layer is deposited to be thicker than the third material layer.

20. The method of claim 15, wherein the step of forming the first insulating film includes forming the first insulating film to cover an exposed lower surface of the gate insulating film.

21. The method of claim 15, wherein the step of forming the first insulating film includes forming the first insulating film to cover a side of the gate insulating film, an exposed upper surface of the gate insulating film, and a side and an upper surface of the gate electrode.

22. The method of claim 15, further comprising the steps of:
forming a second insulating film on the substrate to cover the first insulating film, the first conductor portion and the second conductor portion;
forming a first contact hole connected with the first conductor portion and a second contact hole connected with the second conductor portion in the second insulating film; and
forming a first electrode connected with the first conductor portion through the first contact hole and a second electrode connected with the second conductor portion through the second contact hole, on the second insulating film.

23. The method of claim 15, wherein the first and second conductor portions are formed of an oxide semiconductor material, and formed of a material having resistance lower than that of the semiconductor.

24. The method of claim 15, wherein the first insulating film is formed at a thickness of 30 Å or less.

* * * * *